United States Patent [19]

Erbil

[11] Patent Number: 4,880,670
[45] Date of Patent: Nov. 14, 1989

[54] CHEMICAL VAPOR DEPOSITION OF GROUP IB METALS

[75] Inventor: Ahmet Erbil, Atlanta, Ga.

[73] Assignee: Georgia Tech Research Corporation, Atlanta, Ga.

[21] Appl. No.: 210,022

[22] Filed: Jun. 22, 1988

[51] Int. Cl.$^4$ .................... B05D 3/02; C23C 16/00
[52] U.S. Cl. .................... 427/226; 427/229; 427/248.1; 427/252; 427/314; 556/22; 556/116
[58] Field of Search ........... 427/229, 226, 252, 314, 427/248.1; 556/22, 112

[56] References Cited

U.S. PATENT DOCUMENTS

| | | | |
|---|---|---|---|
| 2,920,090 | 1/1960 | Lindstrom et al. | 556/112 |
| 3,071,493 | 1/1963 | Whaley et al. | 427/252 |
| 3,914,515 | 10/1975 | Kane | 427/252 |
| 4,361,497 | 11/1982 | Boldt et al. | 556/22 |
| 4,522,932 | 6/1985 | Mitchell | 502/153 |

Primary Examiner—Janyce Bell
Attorney, Agent, or Firm—Oldham & Oldham Co.

[57] ABSTRACT

Coatings of Group IB metals are formed by chemical vapor deposition, in which a heat decomposable organometallic compound of the formula (I)

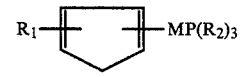

where M is a Group IB metal such as copper, and R is a lower alkyl radical containing from 1 to about 6 carbon atoms, is contacted under nonoxidizing conditions with a heated substrate which is above the decomposition temperature of the organometallic compound. The pure metal is obtained when the compound of the formula I is the sole heat decomposable compound present and deposition is carried out under nonoxidizing conditions. Intermetallic compounds such as copper indium diselenide can be deposited from a copper oxide compound of formula I and a heat decomposable selenium and indium compounds under nonoxidizing conditions. Group II metal oxides and salts, such as barium titanate, are obtainable by deposition from a compound of formula I (and an additional organometallic compound when required) under oxidizing conditions.

16 Claims, No Drawings

CHEMICAL VAPOR DEPOSITION OF GROUP IB METALS

TECHNICAL FIELD

This invention relates to processes for forming a thin metallic coating on a heated substrate by decomposition of a thermally decomposable organometallic compound, and to thermally decomposable organometallic compounds used in such processes.

BACKGROUND ART

Chemical vapor deposition has been extensively described in the literature (including patents) as a technique for depositing a thin metallic coating on a heated substrate. Basically, a heat decomposable volatile metal compound (usually an organometallic compound), which may be called the precursor, is contacted with a substrate which has been heated to a temperature above the decomposition temperature of the metal compound. The metallic coating may be a metal, metal mixture or alloy, or metal compound or mixture thereof, depending on the choice of precursor(s) and reaction conditions.

While the technique has been described with reference to most transition metals and to certain other metals (including copper) and metalloids (silicon, for example), commercial use of CVD for the most part has been confined to deposition of a few metals and metal compounds, such as silicon, tungsten, and certain III-V and II-VI compounds (denoting, respectively, a compound of a Group III metal and a Group V element, and a compound of a Group II metal and a Group VI element). The absence of suitable heat decomposable organometallic compound for elements other than those mentioned above appears to have limited the extension of CVD to the deposition of other metals or compounds.

It is known that copper forms the compound cyclopentadienyl triethylphosphine copper (I), having the formula $C_5H_5CuP(C_2H_5)_3$, by the reaction of cyclopentadiene and triethylphosphine on cuprous oxide. A description of the compound is given by G. Wilkinson et al. in *J. Inorganic and Nuclear Chemistry*, 1956, Vol. 2, pp. 32–37. This white crystalline solid melts at 127° C. and its volatility is very low (around $10^{-2}$ at 100° C.). The melting point and the non-volatile nature of this compound make it unsuitable for chemical vapor desposition applications.

G. Ortaggi, in *Journal of Organometallic Chemistry*, vol. 80, 1974, pp. 275–279, reports preparation of cyclopentadianyl triphenylphosphine gold (I), methylcyclopentadinyl triphenylphosphine gold (I), and cyclopentadienyl triethylphosphine gold (I) No melting points or volatility data are given, but based on their similarity to the analogous copper compound described in Wilkinson cited supra, it is believed that these compounds also would not be sufficiently volatile for use in chemical vapor deposition.

DISCLOSURE OF THE INVENTION

According to this invention, a metallic coating is formed on a heated substrate by contacting a heat decomposable organometallic compound having the formula (I)

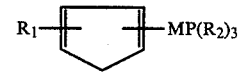

where M is a metal of Group IB of the Periodic Table, or a mixture thereof, and $R_1$, and $R_2$ are each a lower alkyl or alkenyl radical containing from 1 to about 6 carbon atoms, with the substrate, which is at a temperature above the decomposition temperature of the organometallic compound.

The terms, "metal of Group IB of the Periodic Table" and "Group IIIB metal" herein, refer to the Periodic Table as shown on page 789 of "The Condensed Chemical Dictionary"; 10th edition, 1981, by G.G. Hawley, published by Van Nostrand Reinhold Company, New York, and include the lanthanide and actinide series metals.

M is preferably copper or silver, most preferably copper. $R_1$ and $R_2$ are preferably lower alkyl, especially a lower alkyl radical containing from 2 to 4 carbon atoms.

The definitions of M, $R_1$ and $R_2$ are uniform throughout the specification and claims.

BEST MODE FOR CARRYING OUT THE INVENTION

The heat decomposable organometallic compounds which are used as precursors in the practice of this invention meet the following requirements: (1) they are liquids at 100° C., (i.e. the melting points are below 100° C.); (2) they have vapor pressures of at least 0.1 torr at 100° C.; (3) they clearly decompose to deposit metal with little or no carbon incorporation (i.e., not more than about 5 percent by weight of carbon in the metal); (4) they are thermally stable at temperatures below about 1150° C.; and (5) they thermally decompose with the deposition of metal at a temperature from about 150° to about 1000° C.

The low melting points and the large temperature difference between the melting point and the decomposition temperature of precursor compounds used herein make it possible to disperse the liquid precursors into a carrier gas stream at convenient operating temperatures without risk of premature decomposition. High vapor pressure at 100° C., assures a sufficiently high concentration of precursor in carrier gas for effective metal oxide deposition. The thermal decomposition temperatures of the precursors are low enough for economical operation, with few if any requirements for special high temperature resistant equipment in most cases. Finally, precursors herein give highly pure deposits under suitable deposition conditions.

The precursors used herein meet the above requirements and generally have lower melting points and higher vapor pressures at 100° C., and usually have greater temperature differences between the melting point and the decomposition temperature than their cyclopentadienyl metal analogs in which the cyclopentadienyl radical is unsubstituted.

Precursors for depositing Group IB in metals in accordance with this invention are compounds of formula (I) as aforedescribed.

The metal M in formula (I) may be, for example, copper, silver or gold. M is preferably copper or silver, most preferably copper.

The aliphatic substituent $R_1$ and $R_2$ may be the same or different. Each contains from 1 to about 6 carbon atoms, preferably 2 to about 4 carbon atoms, and may be either alkyl or alkenyl, preferably alkyl. Suitable alkyl substituents include ethyl, propyl, isopropyl, butyl, isobutyl, sec-butyl, pentyl and hexyl. Suitable alkenyl substituents include vinyl, allyl, isopropenyl, 1-butenyl, 2-butenyl and 3-butenyl. The alkyl substituents are preferred. The alkyl or alkenyl substituent $R_1$ imparts higher volatility, so that the organometallic compounds of this invention have lower boiling points and higher vapor pressures at 100° C. than do the analogous unsubstituted cyclopentadienyl compounds (those of the formula I above except that $R_2$ is hydrogen).

Representative organometallic precursor compounds of formula (I) which are suitable for deposition of a Group IB metal or compound thereof include ethylcyclopentadienyl copper triethylphosphine, isopropylcyclopentadienyl copper triethylphospine, and the corresponding silver and gold compounds. Methyl, propyl, isopropyl, butyl, isobutyl, sec.-butyl, tert.-butyl, pentyl (all isomers) and hexyl (all isomers) homologs of the above compounds are also suitable.

GENERAL METHOD FOR PREPARING PRECURSORS

Organometallic precursor compounds of Formula (I) can be prepared by the general method described below. This method proceeds according to the following equations (I) through (3).

(1) $C_5H_6 + Na \rightarrow NaC_5H_5 + \frac{1}{2} H_2$
(2) $NaC_5H_5 + R_1Br \rightarrow R_1C_5H_5 + NaBr$
(3) $2 R_1C_5H_5 + Cu_2O + 2P(R_2)_3 \rightarrow (R_1C_5H_4)CuP(R_2)_3 + H_2O$ Sodium cyclopentadienide may be prepared according to equation (1) by reacting monomeric 1,3-cyclopentadiene in an inert solvent such as tetrahydrofuran (THF) with an excess of metallic sodium. The resulting solution of sodium cyclopentadienide (in THF) may be reacted in another vessel (away from excess sodium) with a lower alkyl bromide (e.g., ethyl bromide) according to equation (2) by adding the alkyl bromide through a dropping funnel. The resulting sodium bromide is allowed to settle. The alkylcyclopentadiene in solution may be transferred to another vessel containing cuprous oxide, $Cu_2$. A trialkylphosphine, e.g., triethylphosphine, may be added dropwise with stirring at elevated temperature (e.g., 60° C. for two hours). The solvent may be removed by vacuum and the product recovered by high vacuum distillation. The entire series of reactions is carried out in the absence of air, e.g., under vacuum or in an argon atmosphere.

Alkenyl analogs may be prepared by the above method, with the substitution of an alkenyl bromide (e.g., allyl bromide) and/or a trialkenyl phosphine (e.g., trivinylphosphine) for the corresponding alkyl compounds.

DEPOSITION OF THIN COATINGS

It is possible to prepare thin coatings of alloys, mixtures and compounds of Group IB metals according to this invention. A pure metal M can be deposited by contacting a single precursor compound of formula (I) with a heated substrate under non-oxidizing and preferably reducing conditions, with no other heat decomposable metal compounds present.

Mixtures of Group IB metals (e.g., a mixture of silver and gold) can be deposited from a mixture of precursors of formula (I), in which each precursor is a compound of one of the metals.

Alloys, mixtures and inter-metallic compounds can also be deposited according to this invention. For example, gold-silicon alloy can be deposited by using as precursor a gold compound of formula (I), such as ethylcyclopentadienyl gold triethylphosphine, and a heat decomposable silicon compound, preferably one which meets the general requirements for precursors listed above. Copper-silicon alloy can be similarly deposited, using a copper compound of formula (I) and a heat decomposable silicon compound as precursors. A representative silicon precursor is silane. Deposition is under nonoxidizing conditions, preferably under reducing conditions.

Copper oxide coatings can be formed by contacting a precursor compound of formula (I) with a heated substrate in the presence of an oxidizing agent, which is a mildly oxidizing gaseous oxygen source. The oxidizing agent may be any gaseous reactant which is capable of reacting with the organometallic precursor compound(s) at the decomposition temperatures of the latter to form metal oxide deposits. Oxygen compounds, such as nitrous oxide, carbon dioxide, THF (tetrahydrofuran) and steam, are better suited than oxygen or air to the deposition of metal oxides and oxygen-containing salts because the oxygen compounds react with organometallic compounds only at high temperatures. The oxidizing agent may be introduced into the reactor in admixture with a carrier gas. For example, nitrous oxide/nitrogen and carbon dioxide/hydrogen oxidizing mixtures are suitable. The precursor and the oxidizing agent are supplied in separate streams to avoid premature reaction.

The above method for preparing oxide coatings can be used with appropriate choice of precursor and oxidizing agent, to prepare other coatings of other Group IB metal compounds, especially salts. Examples of such coatings include lanthanum silver sulfide, copper indium diselenide, and silver bromide. Appropriate precursors are a Group IB metal compound of formula (I), a compound yielding the second metal when present, and an agent yielding the desired nonmetal (e.g., sulfur or a halogen). The oxidizing agent, may be, for example, a sulfite, or a sulfide, a halogen (e.g., chlorine), or a compound yielding sulfur as a sulfide on decomposition i.e., diethyl sulfide. Coatings of oxygen-containing salts can also be formed according to this invention. For example, a yttrium barium copper oxide coating can be formed by supplying streams of a copper compound of formula (I), heat decomposable organometallic compounds of yttrium and barium, and an oxidizing gas to a heated substrate.

The substrate can be any material, usually either metallic or ceramic, on which an adherent metallic coating can be formed and which can be heated to a temperature above the decomposition temperatures of the precursor compounds. Thus, the substrate, can be a ceramic material such as glass or quartz, or a metal such as iron, nickel, titanium, tungsten, copper or aluminum. The substrate must be a solid at the decomposition temperature of the precursor. This poses no problems when the melting or softening point of the substrate is above 1000° C. When the desired substrate has a melting or softening point below about 1000° C. (which is the case with aluminum, certain other metals, and most glasses), one must use a precursor compound whose decomposition temperature is lower than the melting or softening point of the desired substrate.

The substrate can be of any desired shape, either regular or irregular. Thus, the substrate can be a rectangular solid or other solid characterized by flat exterior surfaces. Cylindrical surfaces, such as rods and wires, can also be coated according to this invention. Spherical surfaces and other curved surfaces can also be coated. The substrate can even be hollow, as for example, a tube or a hollow sphere having openings to the exterior.

Ductile metallic rods and wires are preferred substrates.

The desired metallic coating can be formed on the desired substrate by methods known in the art. "Metallic" in this connection includes pure metals, mixtures, alloys, and metal compounds (including inter-metallic compounds, metal oxides and salts). Conventional chemical vapor deposition (CVD), chemical beam epitaxy (CBE) or metal-organic molecular beam epitaxy (MO-MBE) techniques, and variations thereof, can be used. Broadly, "chemical vapor deposition" or "CVD" includes any process in which a metallic coating is deposited on a heated substrate by decomposition of one or more precursor compounds. In conventional CVD the reactants are carried into the deposition region by carrier gas flow. Where, as here, a metallic coating is to be formed on a heated substrate, it is usually desirable to convey the organometallic precursor compound(s) and the oxidizing agent (where used) to the substrate in separate carrier gas streams in order to avoid premature reaction. In CBE or MO-MBE (these two terms are used synonymously herein), the reactants are introduced as separate streams into a high vacuum chamber and expanded to form molecular beams which are impinged line of sight on to a heated substrate. The molecular beams strike the hot substrate and deposit metals, which may be oxidized by an oxidizing gas stream to the corresponding oxides. Conventional CVD, CBE and MO-MBE techniques have been described in the literature, particularly the literature pertaining to deposition of silicon and III-V compounds.

The foregoing processes can be carried out in any apparatus which includes a gas-tight chamber or gas space having means for supporting a substrate, means for heating this substrate to a temperature above the decomposition temperature of the decomposable metal compound, an inlet conduit for admitting gas or vapor streams of decomposable organometallic compound and oxidizing agent, and an outlet conduit for removing a stream of carrier gas, decomposition products and undecomposed metal compound from the chamber. Suitable apparatus of various types are well known in the art.

For CVD processes it is preferred to supply the organometallic compound(s), and the oxidizing agent where used, in streams of carrier gas. The preferred carrier gas for the organometallic compounds in hydrogen, argon, nitrogen, or a mixture of these. The desired mole fraction of each organometallic compound can be achieved by bubbling the carrier gas through a body or pool of the liquid organometallic compound at a rate and bubbler temperature (which is the same as the pool temperature) which will give the desired mole reaction. The bubbler temperature is typically from the melting point of the organometallic compound to about 100° C. In the case of ethylcyclopentadienyl copper triethylphosphine, the bubbler temperature may be about 20° C.

When more than one organometallic precursor compound is required, the various organometallic compounds are preferably entrained in separate carrier gas streams, which are combined into a single carrier gas stream and directed to the heated substrate. The mole ratio of the metals in the combined carrier gas stream is typically but not necessarily the same as the mole ratio of the metals in the coating, since metals do not always deposit in the same proportion as that in which they are present in the carrier gas. It is possible to supply the organometallic compounds in undiluted form at reduced pressure (say about 0.1 atmosphere or less) to the reactor, but use of a carrier gas is generally preferred because it affords better process control and does not require as high vacuum. The oxidizing agent where used (e.g., nitrous oxide, carbon dioxide, THF or steam) is also preferably contained in a non-oxidizing carrier gas. For example, nitrous oxide may be diluted with nitrogen, and carbon dioxide and steam can be diluted with hydrogen. Separate streams of organometallic compounds and oxidizing agent are supplied to avoid premature decomposition of the organometallic compounds.

The substrate temperature for all processes according to this invention, whether CVD, MO-MBE (metalorganic molecular beam epitaxy) or CBE (chemical beam epitaxy) is above the decomposition temperature of the organometallic precursor compound, and is in the range of 150° C. to 1000° C. A preferred substrate temperature is in the range of about 200°–300° C. regardless of which process is used.

CVD processes using a carrier gas are typically carried out in the pressure range of about 0/1 torr to about atmospheric pressure (760 torr), although higher or lower pressures can be used. MO-MBE or CBE process are typically carried out under high vacuum. For example, in preferred MO-MBE and CBE process, the reactor pressure is typically about $10^{-5}$ torr during crystal growth (i.e., while organometallic compounds are actually being supplied to the substrate), with a typical background pressure from $10^{-10}$ to $10^{-9}$ torr. The low background pressure in MO-MBE allows for fast switching of material composition, which is important in growing ultra thin layers and other multilayer coatings in which there are abrupt composition and sloping changes from layer to layer.

Decomposition products are removed from the reactor in all processes herein described via the outlet provided for that purpose.

Products of this invention may have any desired coating thickness ranging from monomolecular up to about one millimeter. A preferred range of thickness is from about 0.1 to about 100 microns, especially from about 0.1 to about 20 microns. Coating thickness can be controlled by controlling the flow rate of the. organometallic compounds and the length of time over which these compounds are supplied. Products of this invention may be characterized as composite articles having a thin metallic coating thereon.

Single layer coatings, usually of substantially uniform composition throughout, can be achieved with any of the processes described herein. Multiple layer coatings having different compositions are best achieved with MO-MBE or CBE.

Epitaxial, polycrystalline and amorphous coatings can all be obtained in accordance with this invention.

Coatings produced according to this invention usually have a high degree of conformity. That is, the thickness of the coating is very nearly uniform even when the substrate has an irregular rough surface. This can be realized by depositing the coating in a surface kinetic limited regime (i.e., under conditions such that surface kinetics limit the deposition rate) at relatively low temperatures.

Processes of this invention offer a range of composite articles, comprising metallic coating or film on a substrate at low cost. High quality films of excellent purity are obtained. Low operating temperatures can be used, since in general the organometallic precursor compounds used herein have lower decomposition temperatures than their unsubstituted cyclopentadienyl metal analogs. Faster metal oxide deposition rates are made possible, particularly in CVD processes, by the relatively high vapor pressures of the organometallic precursor compounds used herein. The relatively wide "window" or temperature range between melting point and decomposition temperature makes the precursor compounds herein easy to handle.

Products of this invention have a number of uses. For example, Group IB metals are used widely in the metalization of circuitry in microelectronics. These may be deposited on conventional insulating substrates such as glass, plastic or printed circuit board. Desired patterns can be formed by conventional techniques. Other uses include superconducting devices, storage devices, and decorative coating. Other uses include thin film resistors and capacitors, solar cells, and optical mirrors and coatings.

Homologs of the title compound can be prepared according to example 1, substituting another alkyl bromide such as isopropyl bromide, for ethyl bromide, and/or another trialkylphosphine, such as tri-isopropylphosphine, for triethylphosphine.

Corresponding silver compounds can be prepared according to example 1, substituting silver oxide for cuprous oxide.

Corresponding gold compounds can be prepared according to the method of Ortaggi cited supra, substituting ethylcyclopentadienyl lithium for cyclopentadienyl lithium or methylcyclopentadienyl lithium.

EXAMPLE 1

Ethylcyclopentadienyl-triethylphosphine copper:

Sodium cyclopentadienide was prepared by using 10 g of fine sodium beads and 12.5 ml of monomeric cyclopentadiene in 250 ml of THF. This solution was then transferred to another vessel (away from excess sodium) and stirred while adding 14 ml of ethyl bromide. After completion, the NaBr was allowed to settle. This solution containing ethylcyclopentadiene was transferred onto 25 g of copper (I) oxide. Then 12.5 g of triethyl phosphine were added dropwise while the solution was stirred. The mixture was allowed to stir at 60° C. for 2 hours. The contents of the flask were transferred to another vessel and the solvent was removed by vacuum. The product was distilled at $10^{-2}$ torr in temperature range of 110° C.–130° C. as a clear, volatile liquid. About 10 grams of product were obtained. The compound is very air sensitive. The vapor pressure was about a few torrs at room temperature. It was crucial to keep the temperature low during the distillation since the compound begins to decompose at about 140° C.

For the deposition experiments, a gas-tight reactor having inlet and outlet ports and a quartz plate substrate mounted on a susceptor therein, is purged with a flowing stream of argon gas. The reactor is depressured to a pressure of 5 torr, and the substrate is heated by electrical resistance heating to a temperature of 250° C. A stream of purified argon carrier gas is bubbled through a pool of ethylcyclopentadionyl triethylphosphine copper, which is at a temperature of 20° C. The carrier gas flow rate is 100 sccm. The resulting gas stream is continuously flowed into the reactor, which is a transparent pyrex tubing (0.25 inch ID) for 10 minutes. A copper coating, about 0.2 microns thick, was obtained on the inside wall of the tubing. System cleanliness is critical to successful deposition because the precursor is extremely air sensitive.

Other carrier gases, such as hydrogen or nitrogen, can be used in place of argon if desired.

EXAMPLE 2

This example describes deposition of a copper aluminum alloy film on a glass substrate. The procedure of Example 1 is followed except that separate streams of ethylcyclopentadienyl triethylphosphine copper and triisopropyl aluminum, both in argon as the carrier gas are flowed into the reactor at flow rates of 500 sccm and 100 sccm, respectively. Concentrations are such as to give a mole fraction of about $1.5 \times 10^{-3}$ of each reactant. Flow of precursors in carrier gas streams is continued for one hour. A thin film of copper-aluminum alloy with a thickness of 3 microns is deposited.

What is claimed is:

1. A process for depositing a metallic coating on a heated substrate by thermal decomposition of an organometallic compound, said process comprising contacting a vapor of one or more organometallic compounds of the formula (I)

where M is a group IB metal and $R_1$ and $R_2$ are each lower alkyl or alkenyl radicals containing from 1 to 6 carbon atoms, with said heated substrate, said substrate being at a temperature above the decomposition temperature of said organometallic compound.

2. A process according to claim 1 in which M is copper or silver.

3. A process according to claim 1 in which M is copper.

4. A process according to claim 1 in which $R_1$ contains from 2 to about 4 carbon atoms.

5. A process according to claim 1 which $R_1$ is ethyl.

6. A process according to claim 1 in which $R_2$ is ethyl.

7. A process according to claim 1 in which said organometallic compound is supplied in a stream of carrier gas.

8. A process according to claim 7 in which said carrier gas is a non-oxidizing carrier gas and said substrate is in a non-oxidizing atmosphere.

9. A process according to claim 1 in which the temperature of said substrate is from about 150° to about 1000° C.

10. A process according to claim 1 in which said coating has a thickness not greater than about 100 microns.

11. An organometallic compound of the formula (I).

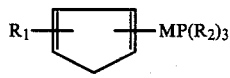

where M is a Group IB metal. and $R_1$ and $R_2$ are each lower alkyl radicals containing from 1 to about 6 carbon atoms.

12. A compound according to claim 11 in which M is copper or silver.

13. A compound according to claim 11 in which M is copper.

14. A compound according to claim 11 in which $R_1$ contains from 2 to about 4 carbon atoms.

15. A compound according to claim 11 in which $R_1$ is ethyl.

16. A compound according to claim 11 in which $R_2$ is ethyl.

* * * * *